(12) United States Patent
Overweg

(10) Patent No.: US 7,417,434 B2
(45) Date of Patent: Aug. 26, 2008

(54) MAGNETIC RESONANCE IMAGING SYSTEM WITH IRON-ASSISTED MAGNETIC FIELD GRADIENT SYSTEM

(75) Inventor: Johannes Overweg, Uelzen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 104 days.

(21) Appl. No.: 11/570,503

(22) PCT Filed: Jun. 2, 2005

(86) PCT No.: PCT/IB2005/051807

§ 371 (c)(1),
(2), (4) Date: Dec. 13, 2006

(87) PCT Pub. No.: WO2005/124381

PCT Pub. Date: Dec. 29, 2005

(65) Prior Publication Data

US 2007/0216409 A1 Sep. 20, 2007

Related U.S. Application Data

(60) Provisional application No. 60/580,577, filed on Jun. 17, 2004.

(51) Int. Cl.
*G01V 3/00* (2006.01)
(52) U.S. Cl. .................... 324/318; 335/296
(58) Field of Classification Search ............. 324/318; 335/296, 297
See application file for complete search history.

(56) References Cited

U.S. PATENT DOCUMENTS

| | | | |
|---|---|---|---|
| 4,652,824 A | 3/1987 | Oppelt | |
| 4,654,596 A | 3/1987 | Savelainen | |
| 4,771,243 A | 9/1988 | Vreugdenhil et al. | |
| 4,823,085 A | 4/1989 | Fuderer et al. | |
| 5,001,447 A | 3/1991 | Jayakumar | |
| 5,036,282 A * | 7/1991 | Morich et al. | 324/318 |
| 5,179,338 A | 1/1993 | Laskaris et al. | |
| 5,278,502 A | 1/1994 | Laskaris et al. | |
| 5,289,128 A | 2/1994 | DeMeester et al. | |
| 5,296,810 A | 3/1994 | Morich | |
| 5,406,204 A | 4/1995 | Morich et al. | |

(Continued)

FOREIGN PATENT DOCUMENTS

EP 0 737 867 A1 10/1996

(Continued)

OTHER PUBLICATIONS

EMRF Foundation; History of Magnetic Resonance Imaging Form a European Point of View; 1995; http://www.emrf.org.

(Continued)

*Primary Examiner*—Brij B Shrivastav
*Assistant Examiner*—Megann E Vaughn

(57) ABSTRACT

A magnetic resonance imaging apparatus includes a main magnet (20) that surrounds an examination region (18) and generates a main magnetic field in the examination region. A magnetic field gradient system (30) is disposed outside of the main magnet. The magnetic field gradient system includes a ferromagnetic yoke (32), and a plurality of magnetic field gradient coils (34) magnetically coupled with the ferromagnetic yoke and selectively producing magnetic flux in the ferromagnetic yoke. The magnetic flux in the ferromagnetic yoke produces selected magnetic field gradients in the examination region.

25 Claims, 11 Drawing Sheets

U.S. PATENT DOCUMENTS 5,696,476 A * 12/1997 Havens et al. ............... 335/216
6,157,276 A    12/2000 Hedeen et al.
6,567,685 B2    5/2003 Takamori et al.
2006/0006866 A1* 1/2006 Roozen et al. .............. 324/318

FOREIGN PATENT DOCUMENTS

| | | |
|---|---|---|
| EP | 0 982 598 A2 | 3/2000 |
| EP | 1 193 507 A2 | 4/2002 |
| JP | 2000 052274 | 2/2000 |

OTHER PUBLICATIONS

Hutchinson, J.M., et al.; A Whole-Body NMR Imaging Machine; 1980; J. Phys. E.: Sci. Instrum.; vol. 13; pp. 947-955.

* cited by examiner

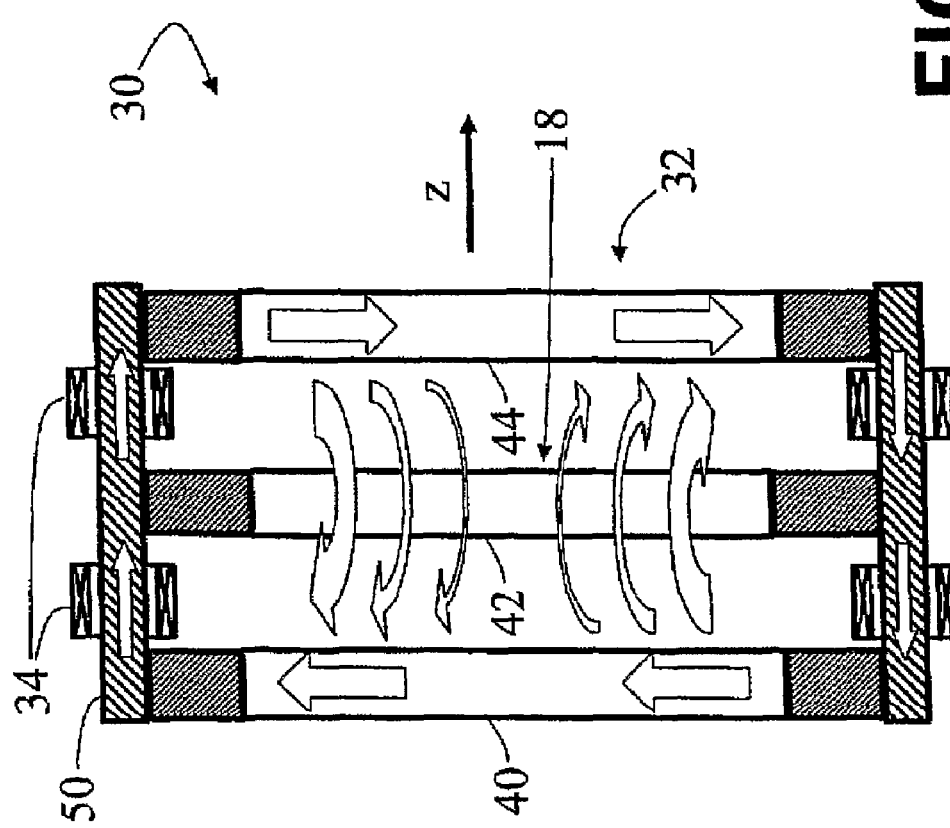

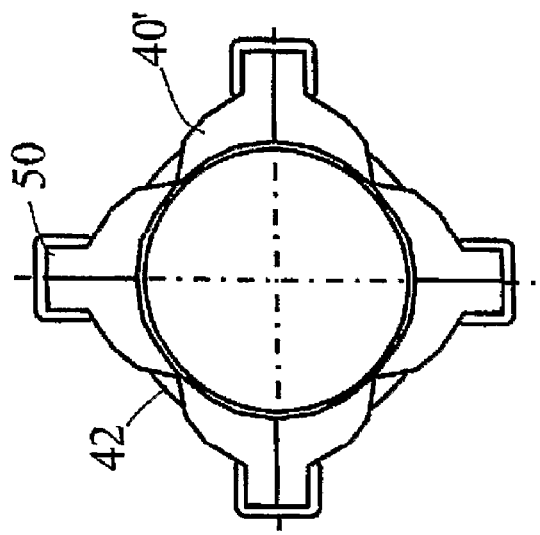
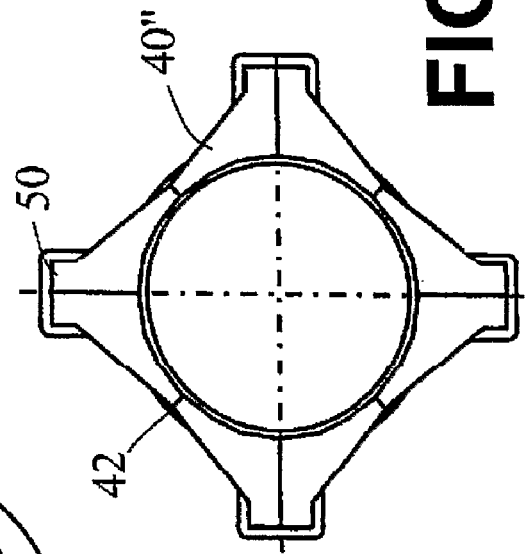
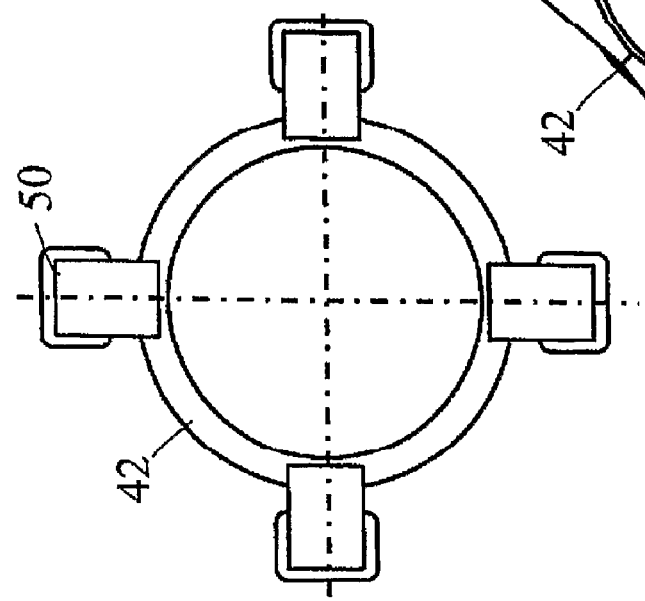

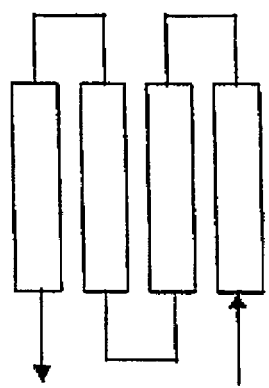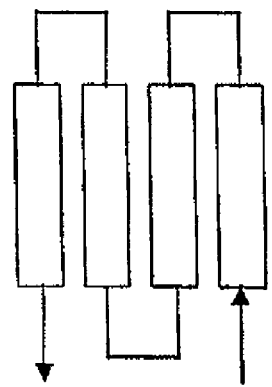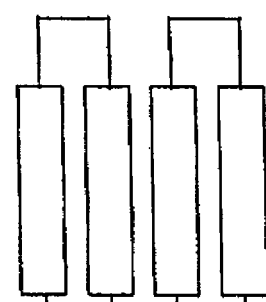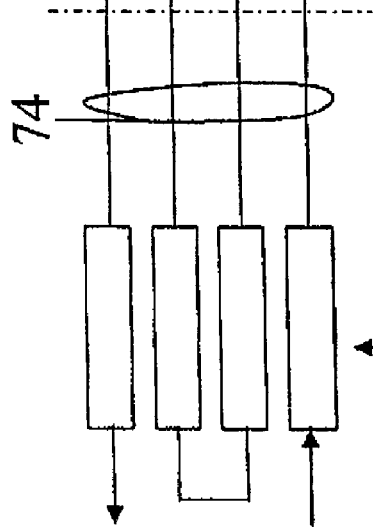
FIG 11A
FIG 11B

MAGNETIC RESONANCE IMAGING SYSTEM WITH IRON-ASSISTED MAGNETIC FIELD GRADIENT SYSTEM

CROSS REFERENCE TO RELATED APPLICATIONS

This application claims the benefit of U.S. provisional application Ser. No. 60/530,577 filed Jun. 17, 2004, which is incorporated herein by reference

DESCRIPTION

The following relates to the magnetic resonance arts. It finds particular application in magnetic resonance imaging, and will be described with particular reference thereto. However, it also finds application in magnetic resonance spectroscopy and other nuclear magnetic resonance techniques.

In the earliest magnetic resonance imaging scanners, such as an early scanner used at the University of Aberdeen (Hutchison et al., J. Phys. E Vol. 13, pp. 947-955 (1980)) and the Proton™ magnetic resonance scanner (made by Philips Corporation), it was difficult to produce a main magnetic field adequate for nuclear magnetic resonance imaging. Accordingly, in these early scanners the main magnetic field was produced by a solenoid electromagnet having a narrow bore just large enough to admit a human imaging subject. The narrow magnet bore concentrated the main magnetic field to provide higher magnetic field strengths; however, other components, including the magnetic field gradient generating system, could not fit inside the bore and thus were disposed outside of the main magnet.

Gradient coils located outside of the main magnet are generally inefficient. For a gradient coil on a cylindrical surface in an air or vacuum ambient, the power for driving a gradient coil increases approximately with the fifth power of the radius of the cylindrical surface. Thus, as more powerful magnets were developed and bore diameters could be increased, the magnetic field gradient coils were inserted inside the main magnet. Indeed, substantially all modern commercial magnetic resonance imaging scanners have the same conventional configuration, in which a powerful main magnet (usually a superconducting magnet) has a relatively large diameter bore inside of which are disposed the magnetic field gradient coils and the radio frequency coils.

However, this conventional configuration in which the gradient coils are placed inside of the magnet has certain disadvantages as well. The gradient coils occupy a substantial amount of space inside of the main magnet bore. Further, energizing the magnetic field gradient coils disposed inside of the powerful main magnetic field produces large Lorentz forces. As a result, the gradient coils produce significant vibration and audible noise when being switched, which can be disturbing to the patient and detrimental to image quality.

Locating the gradient coils outside of the main magnet would reduce noise issues because the main magnet would provide an acoustic barrier between the gradient coils and the patient. Lorentz forces would be substantially reduced by moving the gradient coils outside the main magnetic field. Moreover, locating the gradient coils outside of the magnet bore would allow the main magnet to have a smaller overall bore diameter without reducing the diameter of the usable imaging volume. The manufacturing cost of the main magnet approximately scales with the third power of the linear dimensions; hence, this reduction in bore diameter would provide a substantial reduction in magnet manufacturing costs.

There are, however, substantial impediments to locating the magnetic field gradient coils outside, of the bore of a modern superconducting electromagnet. As noted previously, the operating power for driving the gradient coils increases rapidly with increasing distance away from the imaged volume. The windings or other components of the main magnet can interfere with gradient fields generated outside of the main magnet. Inductive coupling between the outer gradient coils and the main magnet is also a concern. The present inventor, for example, has estimated that switching externally generated magnetic field gradients can induce voltages of 10,000 volts or more in the main magnet. Such high induced voltages can have deleterious effects on winding insulation and other components of the main magnet.

The present invention contemplates improved apparatuses and methods that overcome the aforementioned limitations and others.

According to one aspect, a magnetic resonance imaging apparatus is disclosed. A main magnet surrounds an examination region and generates a main magnetic field in the examination region. A magnetic field gradient system is disposed outside of the main magnet. The magnetic field gradient system includes a ferromagnetic yoke, and a plurality of magnetic field gradient coils magnetically coupled with the ferromagnetic yoke and selectively producing magnetic flux in the ferromagnetic yoke. The magnetic flux in the ferromagnetic yoke produces selected magnetic field gradients in the examination region.

According to another aspect, a magnetic resonance imaging apparatus is disclosed. A main magnet surrounds an examination region and generates a main magnetic field in the examination region. A magnetic field gradient system generates selected magnetic field gradients in the examination region. A vacuum jacket contains at least one of the main magnet and the magnetic field gradient system. The vacuum jacket has a wall defining a bore of the imaging apparatus. The examination region is disposed in the bore. A radio frequency coil is disposed on a surface of the bore outside of the vacuum jacket. A radio frequency shield is disposed on a surface of the bore inside of the vacuum jacket.

One advantage resides in reduced scanner acoustic noise.

Another advantage resides in reduced Lorentz forces in the scanner.

Yet another advantage resides in providing a larger usable scanner bore.

Still yet another advantage resides in reduced main magnet manufacturing cost.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
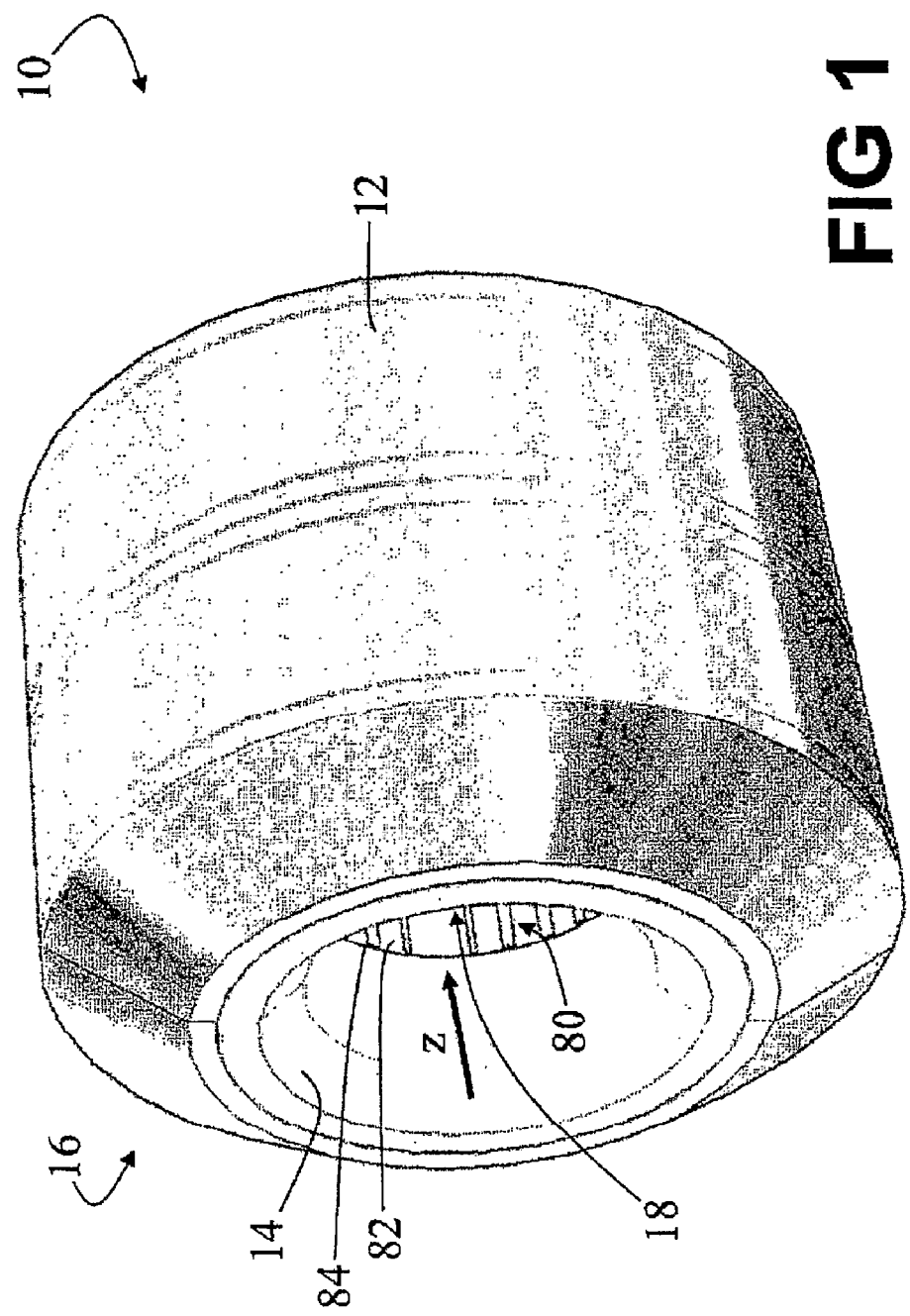
FIG. 1 shows a perspective view of a magnetic resonance imaging system.
Figure 2:
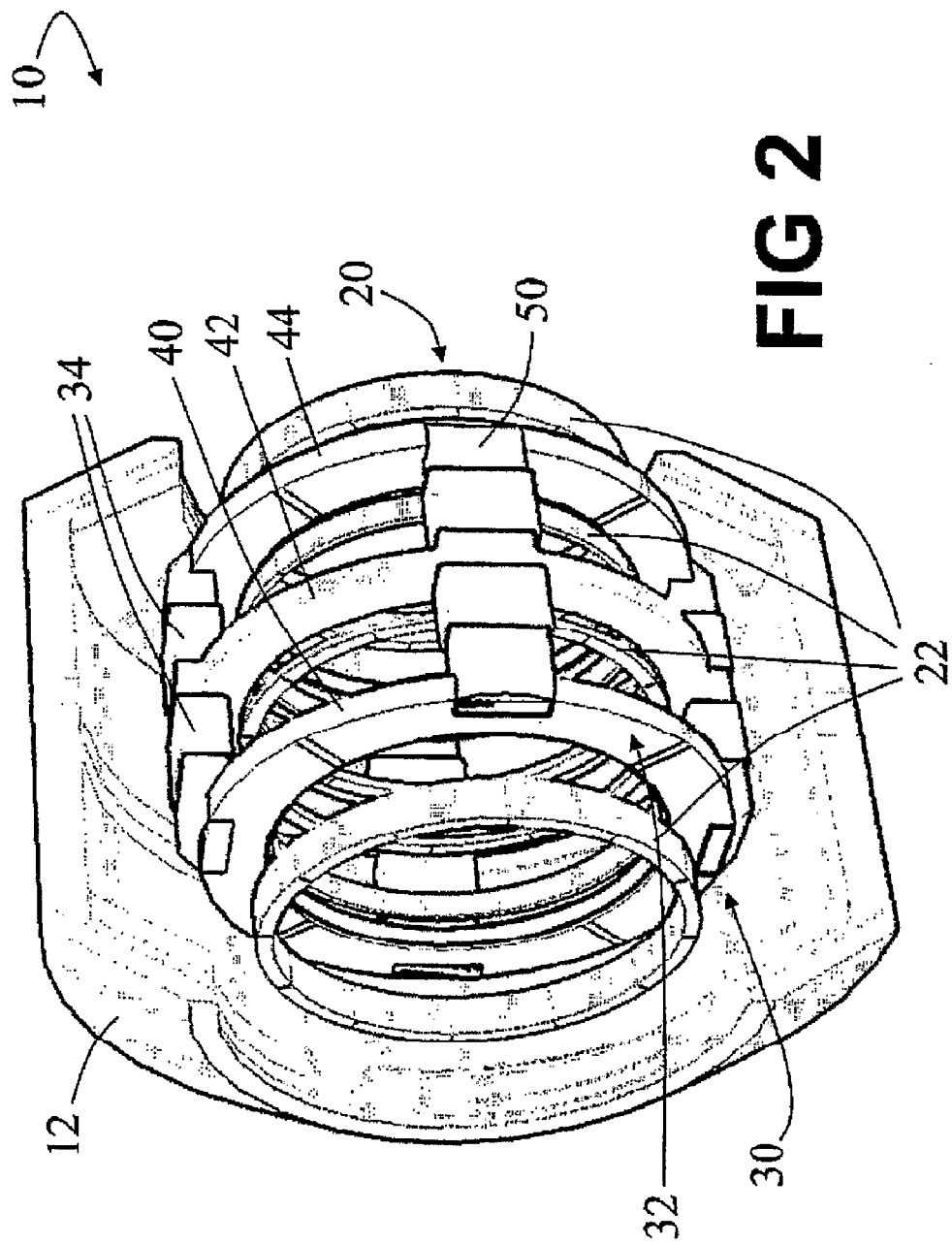
FIG. 2 shows a perspective view of the magnetic resonance imaging system of FIG. 1 in which a portion of the vacuum jacket and the support tube of the main field magnet have been removed to reveal the main magnet coils and the magnetic field gradient system.
Figure 3:
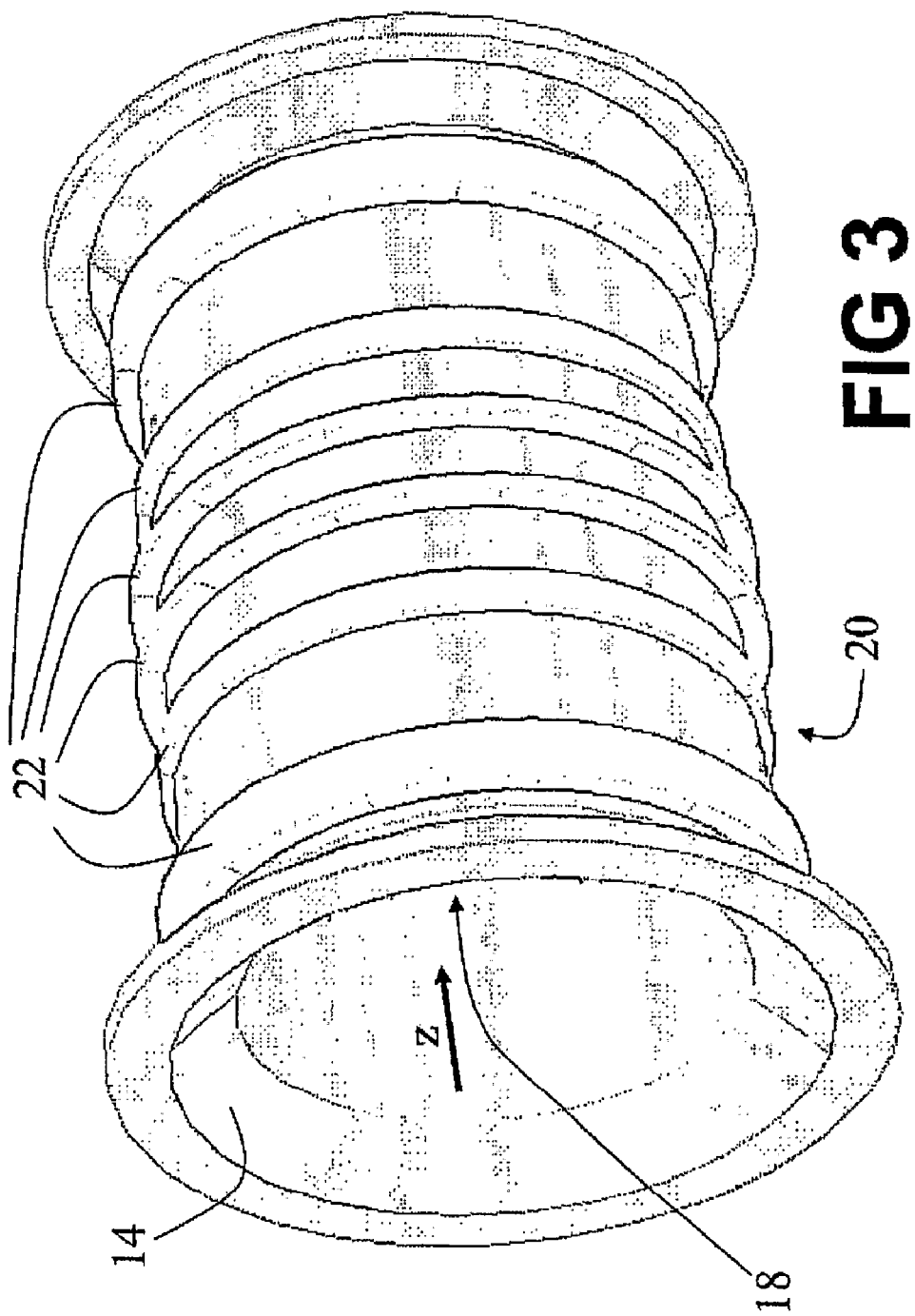
FIG. 3 shows the bore tube of the magnetic resonance imaging system of FIGS. 1 and 2 and the main magnet, which includes six windings segments wrapped around a support tube.
Figure 4:
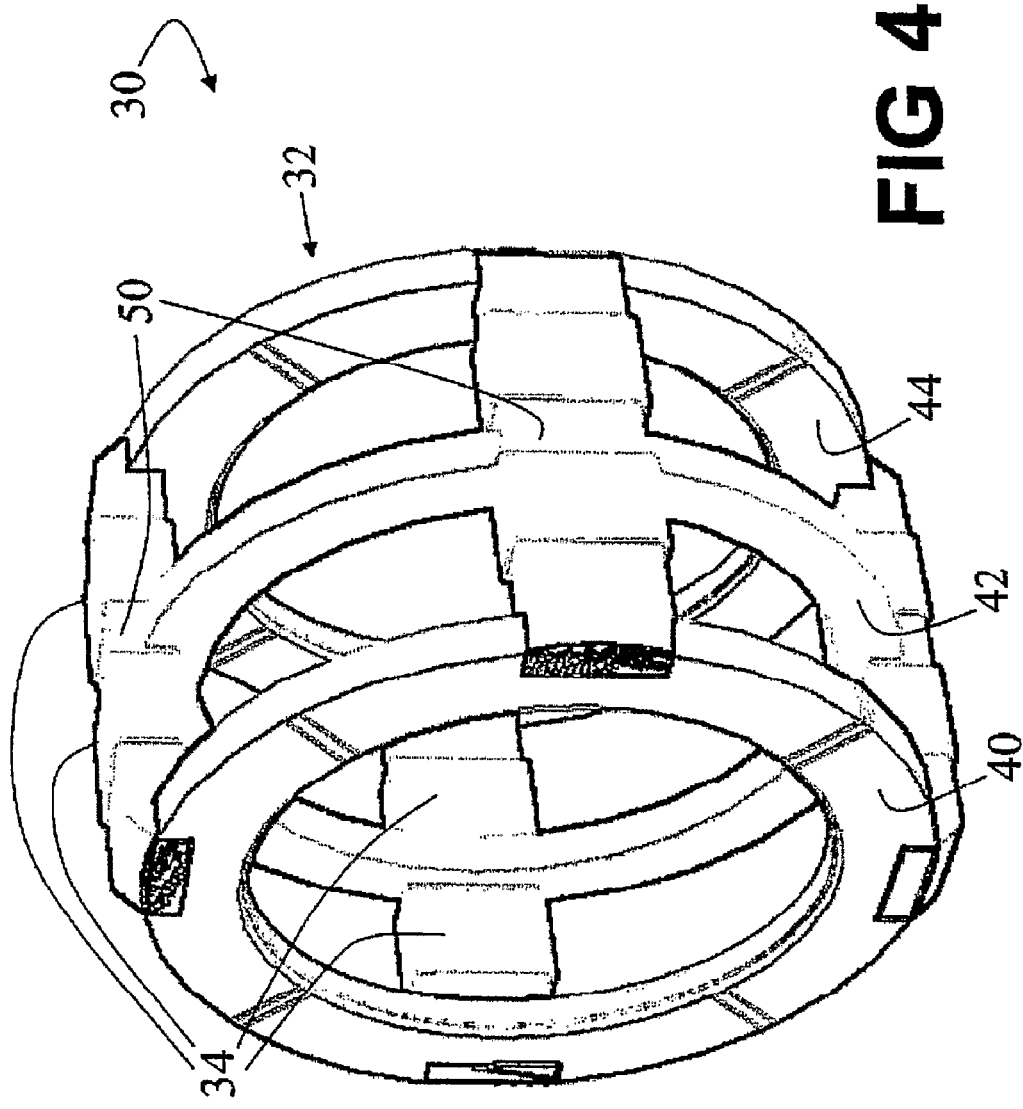
FIG. 4 shows the magnetic field gradient system of the magnetic resonance imaging system of FIGS. 1 and 2.
Figure 5:
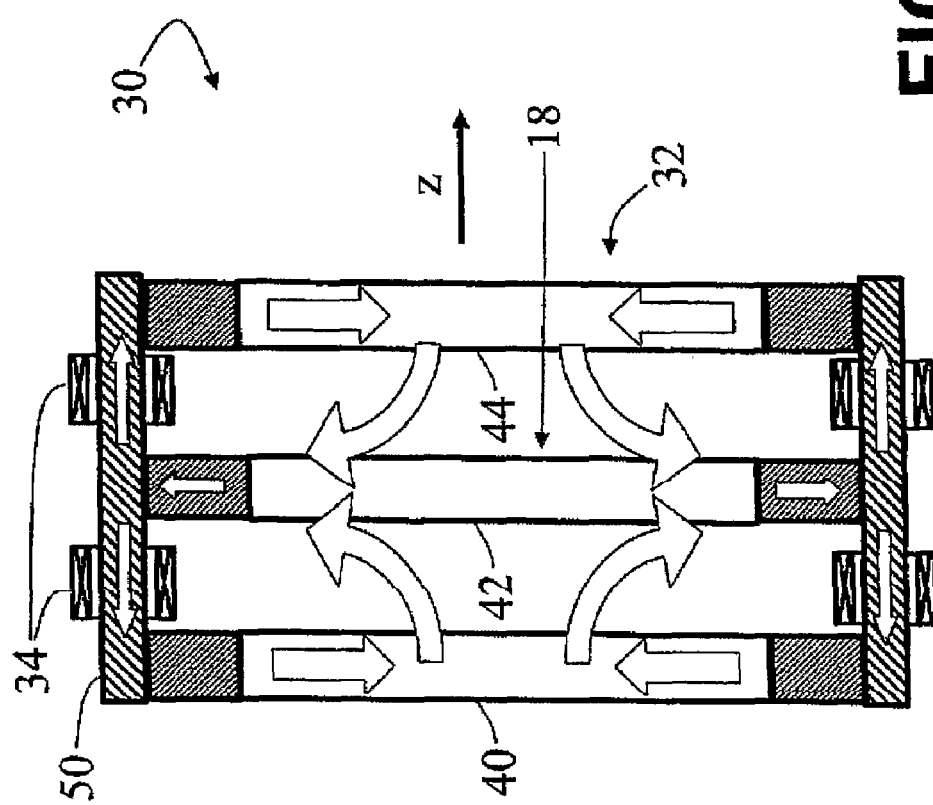

FIG. 5 diagrammatically shows operation of the magnetic field gradient system of the magnetic resonance imaging system of FIGS. 1 and 2 to produce a longitudinal magnetic field gradient in the examination region.

FIG. 6 diagrammatically shows operation of the magnetic field gradient system of the magnetic resonance imaging system of FIGS. 1 and 2 to produce a transverse magnetic field gradient in the examination region.

FIG. 7 shows a ferromagnetic yoke in which the outer ferromagnetic rings are omitted.

FIG. 8 shows a ferromagnetic yoke in which the outer ferromagnetic rings are replaced by flared portions of the crossbars.

FIG. 9 shows a ferromagnetic yoke in which the outer ferromagnetic rings are formed as flared portions of the crossbars which meet to form continuous outer ferromagnetic rings.

Figure 10:
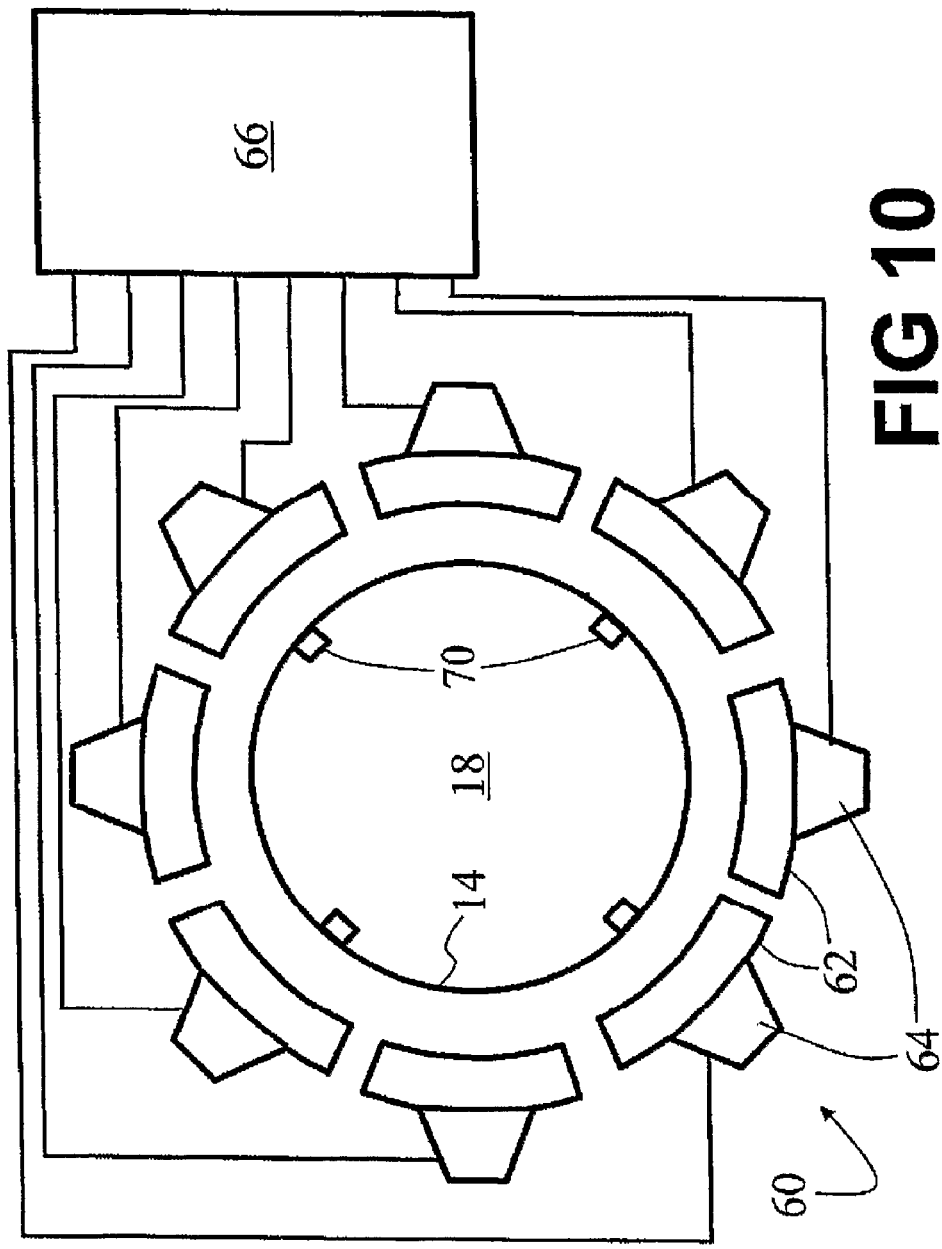

FIG. 10 shows another suitable ferromagnetic flux distribution element for use in the ferromagnetic yoke, in which the ferromagnetic flux distribution element includes a plurality of annularly distributed and spaced apart ferromagnetic segments.

FIGS. 11A and 11B show two suitable winding patterns for winding the central winding segments of the main magnet. The winding pattern of FIG. 1B includes series electrical connections for reducing induced voltages in the magnet.

Figure 12:
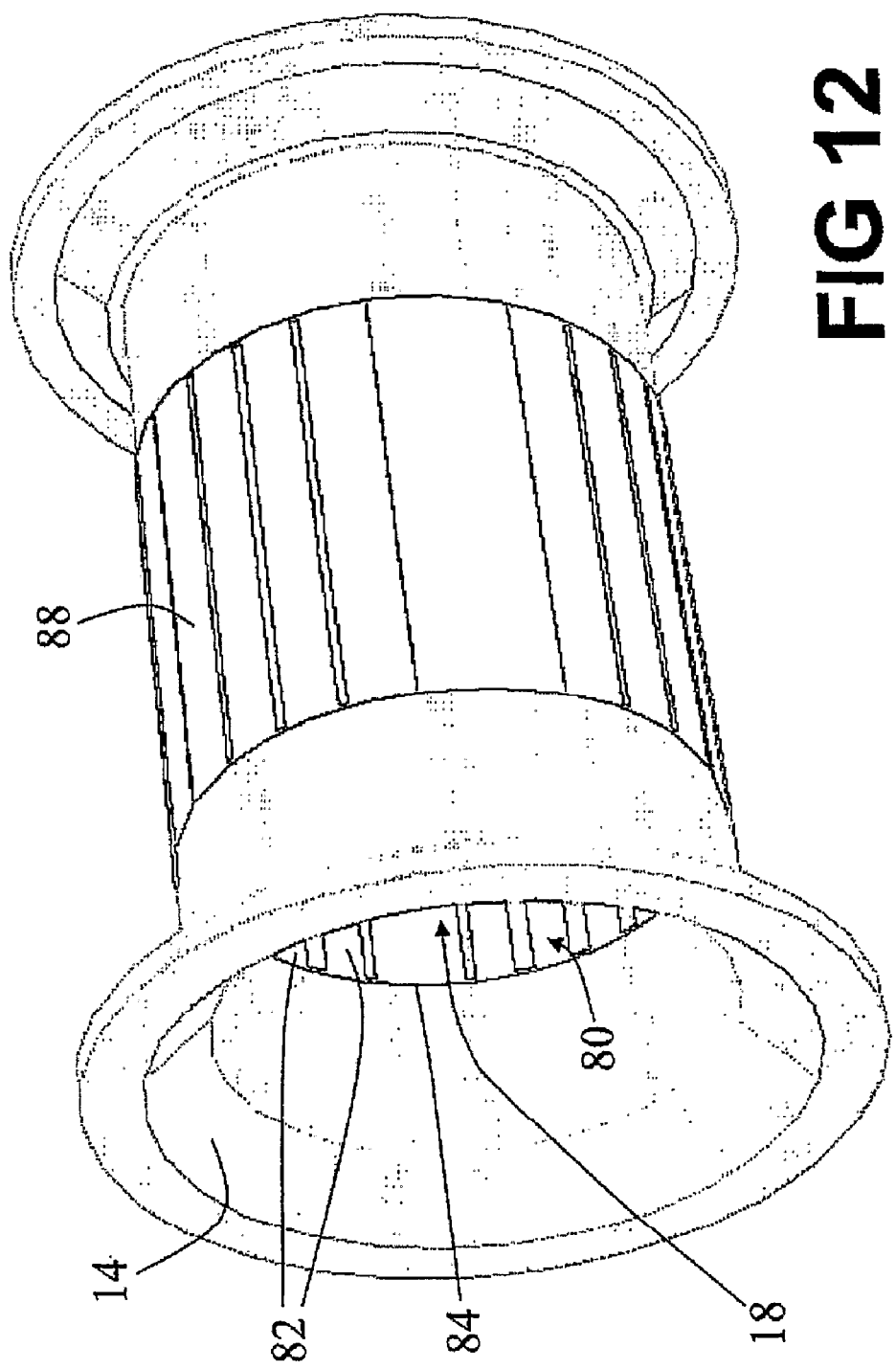

FIG. 12 shows perspective view of a birdcage radio frequency coil including rungs and transverse rings disposed on a surface of the bore tube outside the vacuum jacket and a radio frequency screen disposed on a surface of the bore tube inside the vacuum jacket.

Figure 13:
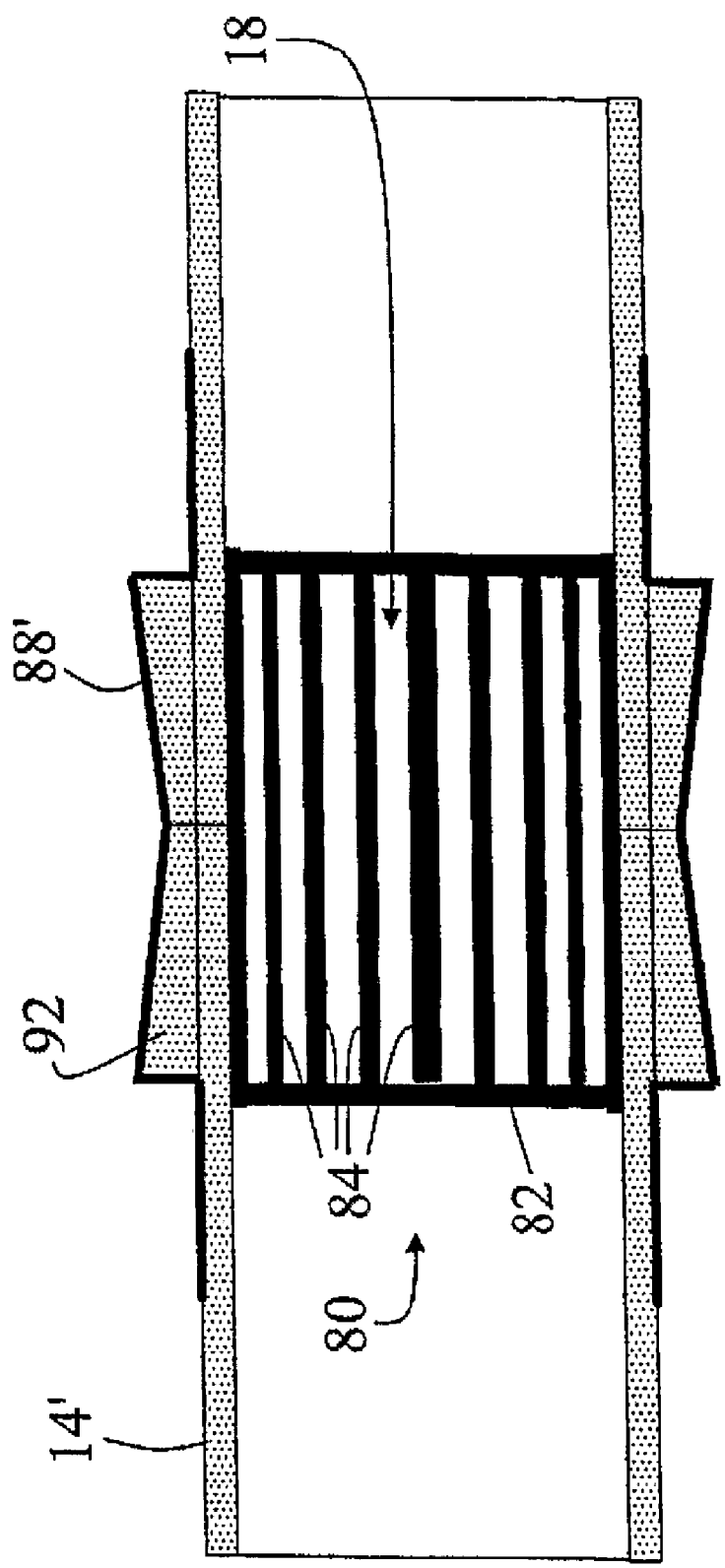

FIG. 13 shows a sectional view of a modified birdcage radio frequency coil in which the bore tube is contoured to provide a taper to the radio frequency screen.

With reference to FIGS. 1-4, a magnetic resonance imaging scanner 10 includes a housing made up of an outer flux return shield 12 and an inner bore tube 14. The outer flux return shield 12 and the inner bore tube 14 are sealed together to define a vacuum jacket 16. An examination region 18 lies inside of the bore tube 14; the patient or other imaging subject is positioned in the examination region 18. A main magnet 20 is disposed inside of the vacuum jacket 16. The main magnet 20 includes a plurality of spaced apart generally annular magnet windings segments 22, six segments in the embodiment of FIG. 1. Each windings segment 22 includes a number of turns of an electrical conductor, preferably a superconductor. Typically, the main magnet 20 is closer to the bore tube 14 than to the flux return shield 12. Although six windings segments 22 are included in the embodiment of FIGS. 1-4, the number of annular magnet winding segments 22 can vary. The magnet 20 can be an assembly of water-cooled copper coils or other resistive coils, or can be made using superconducting technology, such as a niobium-based superconductor operating at about 4 K or a high-temperature superconductor operating at 30-100 K.

The windings segments 22 of the main magnet 20 are designed in conjunction with the flux return shield 12 using electromagnetic simulation, modeling, or the like to produce a substantially spatially uniform magnetic field in the examination region 18 in which the main magnetic field vector is directed along an axial or z-direction parallel to the axis of the bore tube 14. The bore tube 14 is made of a non-magnetic material; however, the outer flux return shield 12 is made of a ferromagnetic material and provides a flux return path for completing the magnetic flux loop. That is, magnetic flux generated by the main magnet 20 follows a closed loop that passes through the inside of the bore tube 14 including the examination region 18 and closes back on itself by passing through the flux return shield 12. As a result, there exists a low magnetic field region within the vacuum jacket 16 between the magnet 20 and the flux return shield 12. In the embodiment of FIGS. 1-4, the flux return shield 12 also serves as the outer portion of the vacuum jacket 16; however, in other embodiments a separate flux return shield can be provided.

A magnetic field gradient system 30 is disposed in the low magnetic field region existing outside the magnet 20 and inside the flux return shield 12. The magnetic field gradient system 30 includes a ferromagnetic yoke 32 and a plurality of magnetic field gradient coils 34. In the embodiment illustrated in FIGS. 2 and 4, the ferromagnetic yoke 32 includes three ferromagnetic rings 40, 42, 44 disposed between the generally annular magnet windings segments 22. Although lying outside the magnet 20, the ferromagnetic rings 40, 42, 44 of the yoke 32 optionally may penetrate partially into the gaps between the main magnet segments 22, depending upon the extent and magnetic field strength of the low magnetic field region near these gaps. The magnetic field gradient coils 34 include wire turns or other electrical conductors wrapped around ferromagnetic crossbars 50 which are arranged generally transverse to the ferromagnetic rings 40, 42, 44 and which are connected with the ferromagnetic rings 40, 42, 44.

The magnetic field gradient system 30 is structurally bilaterally symmetric, with center ferromagnetic ring 42 disposed at the plane of bilateral symmetry, and outer rings 40, 44 symmetrically arranged on either side of the plane of bilateral symmetry. The magnetic field gradient coils are also symmetrically arranged on either side of the plane of bilateral symmetry. The main magnet 20 is also bilaterally symmetric with respect to the same plane of bilateral symmetry. Moreover, the magnetic field gradient system 30 has a four-fold rotational symmetry provided by arrangement of four crossbars 50 at 90° annular intervals. Each crossbar 50 includes magnetic field gradient coils 34 wrapped on either side of the plane of bilateral symmetry.

To avoid magnetic saturation of the ferromagnetic material of the yoke 32, the low magnetic field region between the vacuum jacket 16 and the main magnet 20 should have a small magnetic field background. Typically, the background magnetic field should be about 100 mT or lower; however, the maximum background magnetic field under which the gradient system 30 will suitably operate depends upon the shape and magnetic material properties of the yoke 32. In some embodiments, the flux return shield 12 is sufficient to provide the low magnetic field region. In other embodiments, the flux return shield is provided and additional magnet coil sections (not shown) are located coaxially with the main magnet coil sections 22, but on a larger diameter. These additional magnet coil sections help further reduce the background magnetic field in the vicinity of the gradient system 30. Unlike the shield coils of an actively shielded magnet, these additional coils have the same polarity as the main field coils 22 so as to reduce the magnetic field in the low field region where the gradient system 30 is disposed. The number of ampere-turns of the additional coil sections is typically around 10% or less of the ampere-turns of the main magnet sections 22.

With continuing reference to FIGS. 1-4 and with further reference to FIGS. 5 and 6, operation of the magnetic field gradient system 30 is described. In FIGS. 5 and 6, magnetic flux is diagrammatically indicated by block arrows. In FIG. 5, which shows generation of a longitudinal gradient parallel to the z-axis (i.e., a slice-select gradient for conventional axial-slice imaging), the magnetic field gradient coils 34 are energized to produce magnetic flux in the cross-bars 50 that is directed in opposite directions away from the center ferromagnetic ring 42. This generated magnetic flux is distributed by the ferromagnetic rings 40, 42, 44 such that the flux in the two outer ferromagnetic rings 40, 44 flows in the same direction, towards the centerline of the magnet, while the flux in the center ferromagnetic ring 42 flows in the opposite direction, away from the centerline of the magnet, respective to the magnetic flux in the two outer ferromagnetic rings 40, 44.

The main magnetic field generated by the magnet 20 (not shown in FIGS. 5 and 6) is directed along the z-direction. Leakage magnetic flux passing through the examination region 18 flows parallel to the z-direction on one side of the center ferromagnetic ring 42 (i.e., on the left-hand side in FIG. 5) and thus enhances the main magnetic field. The leakage magnetic flux flows anti-parallel to the z-direction on the other side of the center ferromagnetic ring 42 (i.e., on the right-hand side in FIG. 5) and thus reduces the main magnetic field. The result is a longitudinal gradient imposed on the main magnetic field, which in FIG. 5 is a decreasing magnetic field magnitude from left to right.

Diagrammatic FIG. 5 shows only two of the four crossbars 50. To obtain a z-gradient within the examination region 18 that is substantially uniform across the transverse plane, all the magnetic field gradient coils 34 on all four crossbars 50 are suitably energized with the polarity shown in FIG. 5. Moreover, it will be appreciated that if the polarity of current flow in the magnetic field windings 34 is reversed in FIG. 5, then the direction of the resulting z-gradient within the examination region 18 is also reversed. Still further, the magnitude of the z-gradient is suitably controlled by the magnitude of electric current flowing in the magnetic field gradient coils 34.

With reference to FIG. 6, generation of a transverse gradient perpendicular to the z-axis (i.e., a phase-select or readout gradient for conventional axial-slice imaging) is described. Unlike generation of the z-gradient, the generation of the transverse gradient uses magnetic field gradient coils 34 wrapped on only two opposite crossbars of the four ferromagnetic crossbars 50. For convenience, these will be identified as top and bottom ferromagnetic crossbars 50 in accordance with the orientation shown in FIG. 6. The magnetic field gradient coils on the top crossbar are energized to produce magnetic flux in the cross-bar directed parallel to the z-direction indicated in FIG. 6. The magnetic field gradient coils on the bottom crossbar are energized to produce magnetic flux in the cross-bar directed anti-parallel to the z-direction. The magnetic flux thus generated is distributed principally by the outer ferromagnetic rings 40, 44, and flows in opposite directions in the two ferromagnetic rings 40, 44. The magnetic flux largely bypasses the center ferromagnetic ring 42, which does not contribute substantially to flux distribution in the transverse gradient operating mode.

The magnetic flux flowing in opposite directions in the two outer ferromagnetic rings 40, 44 produces leakage flux that is directed anti-parallel to the z-direction close to the top ferromagnetic crossbar, and also produces leakage flux that is directed parallel to the z-direction close to the bottom ferromagnetic crossbar. At the center of the examination region 18, the leakage flux crosses a zero-point. Hence, a transverse magnetic field gradient is imposed on the main magnetic field in the examination region 18. In FIG. 6, the transverse gradient is an increasing magnetic field magnitude from top to bottom.

In similar fashion, a transverse magnetic field gradient orthogonal to the gradient shown in FIG. 6 is produced by similarly energizing the gradient coils on the two opposing crossbars oriented at 90° to the top and bottom crossbars. Moreover, it will be appreciated that if the polarity of current flow in the magnetic field windings 34 is reversed in FIG. 6, then the resulting transverse gradient within the examination region 18 is also reversed. Still further, the magnitude of the transverse gradient is suitably controlled by the magnitude of electric current flowing in the magnetic field gradient coils 34.

It will be noticed that the center ferromagnetic ring 42 is not used in generating transverse magnetic field gradients. In some contemplated embodiments, the center ferromagnetic ring 42 is omitted, and two cylindrical windings arranged in an anti-Helmholtz configuration serve as z-gradient coils. These cylindrical z-gradient coils are suitably located at or near the inner contour of the outer ferromagnetic rings 40, 44 of the ferromagnetic yoke 32. In other contemplated embodiments, more than three ferromagnetic rings are employed. For example, five rings can be employed, including a center ring and two outer rings symmetrically disposed on each side of the center ferromagnetic ring.

The design and materials selection of the ferromagnetic yoke 32 and the ferromagnetic crossbars 50 determines the efficiency and uniformity of the magnetic field gradient system 30. The ferromagnetic crossbars 50 are intended to efficiently communicate magnetic flux produced by the magnetic field gradient coils 34 to the ferromagnetic yoke 32; hence, these crossbars should have large magnetic permeability. In one embodiment, the crossbars 50 are made of a nanocrystalline $Fe_{73.5}Cu_1Nb_3Si_{13.5}B_9$ alloy described in Y. Yoshizawa, et al., Journal of Applied Physics, Volume 64, page 6044 ff (1988). Other materials with high magnetic permeability, low losses and relatively high saturation magnetization are also suitable as materials for the crossbars 50. High permeability material can also be used for the center ferromagnetic ring 42 of the ferromagnetic yoke 32.

For the outer ferromagnetic rings 40, 44 of the ferromagnetic yoke 32, a high magnetic permeability is generally not desirable. If these outer rings 40, 44 have high magnetic permeability, they will produce insufficient leakage flux in the examination region 18 to support substantial gradient fields. On the other hand, if the magnetic permeability is too small, the gradient field quality will suffer. In some embodiments, the outer ferromagnetic rings 40, 44 have relative magnetic permeability ($\mu_r$) values of between about ten and about forty. Suitable materials for the outer ferromagnetic rings 40, 44 include diluted powders of high permeability and low loss ferromagnetic materials, and laminated ferromagnetic materials.

It is advantageous to have the net magnetization of the crossbars 50 small when the current in the magnetic field gradient coils 34 is zero. This can be achieved by proper choice of the axial position (i.e., position in the z-direction) of the outer ferromagnetic rings 40, 44 of the ferromagnetic yoke 32. If these rings are about mid-way in the gap between neighboring annular magnet windings segments 22, then the crossbars 50 will magnetize in the direction of the field on the axis of the magnet 20. If the ring is close to the inner one of the two neighboring magnet segments 22, the crossbars 50 will magnetize in the opposite direction. There is an optimum position between the two neighboring magnet segments 22 where the net magnetization of the crossbars 50 goes through zero. For a typical main magnet 20, this optimum position lies at about 80% (i.e., four-fifths) of the width of the gap between the magnet sections 22. A further reduction of the yoke magnetization can be achieved by applying a constant bias current to the gradient coils 34, so as to cancel any residual magnetization arising from non-optimum positioning of the outer ferromagnetic rings 40, 44.

With reference to FIGS. 7-9, another design consideration is the shape of the outer ferromagnetic rings 40, 44 of the gradient yoke 32. If the outer ferromagnetic rings 40, 44 are omitted, as illustrated in FIG. 7, the field will concentrate at the ends of the crossbars 50 and the resulting magnetic field gradients will have large higher-order components. With reference to FIG. 8, improved magnetic field gradient homogeneity is obtained by annularly flaring the ends of the crossbars 50 to produce the segmented outer ferromagnetic ring 40'. With reference to FIG. 9, the flaring of the ends of the crossbars 50 is large enough so that the flared portions of the crossbars 50 meet, forming a ferromagnetic outer ring 40" of varying thickness. The precise shapes of the outer ferromagnetic rings 40, 40', 40", 44 can be selected by electromagnetic simulation or modeling to improve the gradient field quality of the gradient system 30. When the ends are flared, the cross-sectional size and shape of the crossbars 50 has less effect on the quality of the magnetic gradient fields, providing greater design flexibility for selecting the size and shape of the crossbars 50.

The embodiment of FIG. 9 has the advantage that it has larger thicknesses at the connections between the crossbars 50 and the ferromagnetic rings 40, 42, 44. At these connections the magnitude of the magnetic flux of the gradient system 30 is largest. In some embodiments, the ferromagnetic rings 40, 42, 44 are non-planar. In some embodiments, the ferromagnetic rings are oriented perpendicular to the direction of the local stray field generated by the main magnet 20. In such an orientation, the magnetization of the ferromagnetic rings by the main field magnet 20 is reduced. A low magnetization of the gradient system 30 due to the main field magnet 20 is desirable because low magnetization maximizes the effective magnetic permeability of the ferromagnetic yoke 32, which reduces the stored magnetic energy.

With reference to FIG. 10, to enable precise control of the magnetic field gradients, a plurality of magnetic field sensors 70 are disposed on the bore tube 14 or at some other location and are used for feedback control by the magnetic field gradient coils power supply 66. Alternatively, pre-emphasis can be employed to correct the gradient waveform for eddy currents, hysteresis, or other time-dependent behavior of the gradient fields.

Magnetic flux leakage in the end rings of the gradient yoke system is reduced by using interrupted ferromagnetic flux distribution segments 62. Gradient inhomogeneity increases by breaking the end rings into segments, but this can be compensated by using more than four segments. For example, in FIG. 10 a ferromagnetic flux distribution element 60 has eight segments 62 annularly distributed around the examination region 18. Each of the ferromagnetic flux distribution segments is connected with a separate ferromagnetic crossbar 64 supporting magnetic field gradient coils (not shown in FIG. 10). The gradient coils of each crossbar 64 are separately driven by a separate channel of a multi-channel magnetic field gradient coils power supply 66. By selectively driving selected gradient coils using polarities analogous to those illustrated in FIGS. 5 and 6, a longitudinal gradient, a transverse gradient of a selected orientation, or a gradient somewhere in-between transversely- and longitudinally-oriented can be produced. Simulation shows that with eight segments 62 at 45° intervals around the examination region 18, good transverse gradient field uniformity is obtained if the ampere-turns of the driving coils are scaled with the cosine of the angular position. The efficiency of such an eight-segment ferromagnetic flux distribution element 60 is better than the arrangement of FIGS. 1-4 which uses four crossbars 50 and continuous ferromagnetic rings 40, 42, 44. To further improve homogeneity, more ferromagnetic segments, such as twelve segments at 30° intervals, can be used. The eight ferromagnetic flux distribution segments 62 are preferably made of a material having a relative magnetic permeability ($\mu_r$) value of between about ten and about forty. The ferromagnetic crossbars 64 are preferably made of a material having a substantially higher relative permeability than that of the segments 62.

While separate driving channels are employed for each gradient coil in the illustrated embodiments, in other embodiments the number of independent gradient coil waveform signals and driving amplifiers can be reduced by grouping the gradient drive coils into three separate circuits, each serving one gradient direction. To do this, the gradient coils 34 are each split into at least two sections: one section serving the z-axis; and the remaining section serving orthogonal transverse axes. The total number of coils for system with four crossbars 50 is increased to sixteen in these embodiments. The first section includes eight gradient coils (two on each crossbar 50) used to generate the z-gradient field, and these coils can be connected in series and powered by a single amplifier. The second section includes four gradient coils (two symmetrically positioned coils on each of two opposing crossbars) for a first transverse gradient (e.g., an x-gradient) and four gradient coils (two coils on each of the other two opposing crossbars) for a second transverse gradient orthogonal to the first gradient (e.g., a y-gradient). The four coils of the first transverse gradient can be connected in series and powered by a second amplifier. The four coils of the second transverse gradient can be connected in series and powered by a third amplifier.

With reference to FIGS. 11A and 11B, inductive coupling between the z-gradient mode and the main magnet 20 can produce large induced voltages (as high as 10,000 volts in some electromagnetic simulations) in the central magnet windings segments 22 which are closest to the plane of bilateral symmetry of the magnet 20. Although the net voltage is zero, because the magnet 20 is bilaterally symmetrical whereas the gradient system 30 has bilateral anti-symmetry, such high induced voltages are undesirable. These induced voltages can be reduced by a suitable selection of the winding scheme of the central windings segments of the main field magnet 20. FIG. 11A shows a conventional winding scheme, in which each of the central winding segments is separately wound. The winding scheme shown in 11B differs in that after winding one or a few layers of one winding segment, the conductor is routed to the mirror-image segment on the opposite side of the plane of bilateral symmetry, and the corresponding part of the mirror-image coil section is wound. This procedure produces series electrical connections 74 between every layer or every few layers of the neighboring magnet windings segments 22. In the winding scheme of FIG. 11B, no large induced voltages can develop, because the voltage cancellation takes place within each layer or within every few layers.

At high gradient switching frequencies, such as around 10 kHz, parasitic capacitances between windings of main magnet coils can effectively short circuit such coils. These capacitive effects should be kept small to avoid substantial perturbation of the z-gradients, for example by selecting a magnet design having a large operating current and correspondingly small number of turns. These capacitive effects can also be reduced by incorporating spacer material between layers of windings of the coil sections, by using a pancake winding scheme for these coil sections or by other methods resulting in lower inter-turn voltages due to net magnetic flux passing through the coil. Typically, if the number of turns of the central main magnet sections can be kept below about 200 turns, the reactive response can be optimized so as not to disturb the z-gradient mode. Optionally, the conductor winding segments 22 of the central magnet 20 are shielded against time-varying fields of the gradient system by wrapping the coils inside a conducting material; however, this conducting wrapping should not form closed loops that can couple with the gradient system.

In the embodiment of FIGS. 1-4, the magnet 20 includes a plurality of spaced apart generally annular magnet windings segments 22, and the magnetic flux distribution elements 40, 42, 44 are disposed in gaps between the magnet winding segments 22. In some contemplated embodiments in which the magnet is a room-temperature copper coil with only a small number of turns (for example, around 100 turns, which can be useful for a low-field magnetic resonance imaging scanner), a continuous winding without gaps is employed. In such an embodiment, the gradient fields produced by the gradient system disposed outside of the main magnet penetrate the windings of the main magnet; however, since the number of turns is small, this penetration is acceptable.

In most embodiments, the magnet 20 is a superconducting magnet, which is cooled to a superconducting operating temperature. The operating temperature depends at least upon the type of superconductor, the magnet current, and the magnet field. A niobium-based superconducting magnet should be cooled to about 4 K, while a high-temperature superconductor may operate at 30-100K. To cool the magnet to superconducting niobium temperatures, a cryostat or cryogenic bath is typically employed, such as a liquid helium bath. For higher operating temperatures, a solid neon cryogen (about 17 K) or a liquid nitrogen bath or cryoshrouding (about 77 K) can be employed. Moreover, at temperatures above about 30 K, conductive cooling can be employed. In conductive cooling, a cold head cooled by a suitable cryogen or cycled refrigerant is thermally conductively coupled with the magnet 20 to remove heat. Cooling can also advantageously be used with resistive magnets, as cooling substantially reduces the resistivity of most electrical conductors.

If cooling of the magnet is employed, then the cooled magnet should be vacuum jacketed to reduce conductive heating from the surrounding room temperature. In the embodiment illustrated in FIGS. 1-4, both the magnet 20 and the magnetic field gradient system 30 are disposed inside of the vacuum jacket 16. This arrangement is appropriate if the magnet 20 and the magnetic field gradient system 30 are in thermal contact with one another, since in this case both the magnet 20 and the magnetic field gradient system 30 should be cooled. If the gradient system 30 is cooled, then the magnetic field gradient coils 34 should be selected to control heating due to switching operations. For example, superconducting windings such as are used in superconducting power transformers can be employed in the gradient windings 34. If the magnet 20 and the magnetic field gradient system 30 are in thermal contact with one another (either cooled or room temperature), then the magnet and gradient system can be assembled as a single mechanically integrated structure disposed inside of the vacuum jacket 16. Advantageously, the vacuum jacket 16 provides substantial acoustic shielding for the gradient system 30.

Alternatively, the magnetic field gradient system can be operated at room temperature while the magnet is cooled. In these arrangements, the magnet and the gradient system are thermally isolated from one another by a vacuum jacket, by fiberglass or another insulating material, or the like. In this case, it is typically more difficult to mechanically integrate the magnet and the gradient system; however, there may be cost savings associated with not cooling the gradient system. The choice of whether and how to cool the magnet, and whether and how to the gradient system, is suitably made based upon the choice of materials for these systems and other thermal engineering considerations. It will be appreciated that even if both the magnet and the gradient system are cooled, different cooling mechanisms can be used for the two components. For example, the gradient system may be cooled to a temperature below room temperature but higher than the operating temperature of the magnet, and this limited gradient system cooling is combined with inserting some thermal insulation between the magnet and the gradient system.

To enable magnetic gradient fields produced by the magnetic field gradient system 30 to reach the examination region 18, there should be no substantial electrically conducting surfaces inside of the gradient system 30. For example, if a radiation shield is used as part of the magnet cooling, it should be slotted to reduce induced eddy currents. The bore tube 14 of the vacuum jacket 16 should be made of an electrically non-conducting material.

In addition to the magnet 20 and the magnetic field gradient system 30, acquisition of magnetic resonance imaging data involves radio frequency excitation and detection at the magnetic resonance frequency. These operations can be performed using a local radio frequency coil or coils array, a whole-body birdcage coil, a whole-body TEM coil, or so forth. However, some of these coils have the disadvantage of occupying a substantial amount of space inside of the bore tube 14.

With reference to FIG. 12, in one embodiment, the bore tube 14 is used as a support for a strip-line radio frequency coil. The bore tube 14 is typically electrically non-conducting so as to permit magnetic field gradients to pass therethrough. For example, the bore tube 14 may be an electrically insulating fiber-reinforced composite tube. A birdcage coil 80 supported by the bore tube 14 includes a plurality of strip-line conductive rungs 82 and transverse conductive strip-line rings 84 disposed on a surface of the bore tube 14 outside of the vacuum jacket 16. That is, the conductive rungs 82 and the transverse conductive strip-line rings 84 are not exposed to the vacuum. (The rungs and rings 82, 84 of the radio frequency coil 80 are also visible in FIG. 1.) In some embodiments, the rungs and rings 82, 84 are printed circuitry disposed or printed directly onto the electrically non-conducting bore tube 14. In other embodiments, the rungs and rings 82, 84 are disposed or printed on separate printed circuit boards or an inner bore liner which is secured to the bore tube 14. In other embodiments, the rungs and rings 82, 84 are foil strips which are adhered to the bore tube 14.

A radio frequency shield or screen 88 is disposed on the vacuum side of the bore tube 14. That is, the radio frequency screen 88 is exposed to the vacuum. The radio frequency screen 88 can be printed directly onto the bore tube 14, or can be disposed on an electrically non-conductive outer bore tube liner that acts as a printed circuit board for the radio frequency screen 88. The thickness of the wall of the bore tube 14 is selected to provide a desired separation between the conductive rungs 82 and rings 84 on the one hand, and the radio frequency screen 88 on the other hand. Typically, a thickness of about fifteen millimeters to twenty-five millimeters is suitable for a whole-body birdcage coil. Optionally, the thickness of the wall of the bore tube 14 is contoured to provide the radio frequency coil 80 with selected radio frequency characteristics. If separate printed circuit boards are used to support the rungs, 82, rings 84, and/or screen 88, then the thickness of those separate printed circuit boards can be selected to provide the desired separation. The size of the radio frequency screen 88 in axial or z-direction is typically larger than the length of the conductive rungs 82 of the birdcage. Optionally, a cosmetic liner (not shown) is placed inside of the bore tube 14 to protect the conductive rungs 82 and rings 84 from contacting a patient or other imaging subject disposed in the examination region 18.

With reference to FIG. 13, a modified bore tube 14' differs from the bore tube 14 in that it includes a contoured portion 92 on which a modified radio frequency screen 88' resides, conforming with the outside surface of the contoured portion 92. In the contoured portion 92, the thickness of the bore tube 14' varies on the outside, to vary the separation between the birdcage conductors 84 and the radio frequency screen 88'. Instead of contouring the outside surface of the bore tube, the inside surface or both surfaces can be contoured. Typically, a separation of about fifteen millimeters to about twenty-five millimeters is suitable. By incorporating a slight taper of the radio frequency screen 88', causing the distance between coil and screen to increase towards the ends of the radio frequency coil 80, it is possible to improve the homogeneity of the radio frequency field without increasing the length of the coil. As seen in FIG. 13, the length of the radio frequency screen 88' in axial direction is typically greater than the length of the conductor rods 84 of the birdcage coil.

Those skilled in the art will recognize that the radio frequency coil 80 and radio frequency screen 88, 88' disposed on opposite sides of the bore tube 14 have general application in magnetic resonance scanner systems in which the bore tube defines a wall of a vacuum jacket containing the main magnet, the gradient system, or both. For example, the described radio frequency coil/screen arrangement may find use in magnetic resonance imaging scanners in which gradient coils are positioned inside of the main magnet and are vacuum-jacketed to reduce noise. Similarly, in some contemplated scanner designs, vacuum-jacketed superconducting gradient coils may be positioned inside of the main magnet (either in the same or a different vacuum jacket from that surrounding the outer superconducting main magnet), and the described radio frequency coil/screen arrangement will find application in these contemplated scanners as well.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging apparatus comprising:
   a main magnet surrounding an examination region and generating a main magnetic field in the examination region, the main magnet including a plurality of spaced apart generally annular magnet segments surrounding an examination region; and
   a magnetic field gradient system disposed outside of the main magnet, the magnetic field gradient system including:
      a ferromagnetic yoke including a plurality of ferromagnetic flux distribution elements disposed between the spaced apart magnet segments, and
      a plurality of magnetic field gradient coils magnetically coupled with the ferromagnetic yoke and selectively producing magnetic flux in the ferromagnetic yoke, the magnetic flux in the ferromagnetic yoke producing selected magnetic field gradients in the examination region.

2. The apparatus as set forth in claim 1, further including:
   a ferromagnetic flux return shield surrounding the main magnet, the ferromagnetic yoke being disposed in a low magnetic field region between the main magnet and the ferromagnetic flux return shield.

3. The apparatus as set forth in claim 1, wherein each ferromagnetic flux distribution element is disposed a first distance from one of the two neighboring magnet segments and a second distance from the other of the two neighboring magnet segments, the second distance being about four times larger than the first distance.

4. The apparatus as set forth in claim 1, wherein each ferromagnetic flux distribution element includes:
   a plurality of ferromagnetic segments annularly distributed around the examination region, the ferromagnetic segments being separated by non-ferromagnetic gaps, each ferromagnetic segment being magnetically coupled with at least one of the magnetic field gradient coils.

5. The apparatus as set forth in claim 4, wherein each ferromagnetic flux distribution element includes at least eight ferromagnetic segments.

6. The apparatus as set forth in claim 1, wherein each ferromagnetic flux distribution element penetrates at least partially into the gap separating the neighboring spaced apart generally annular magnet segments.

7. The apparatus as set forth in claim 1, further including:
   a vacuum jacket surrounding the main magnet, the ferromagnetic yoke, and the plurality of magnetic field gradient coils.

8. The apparatus as set forth in claim 7, further including:
   a ferromagnetic flux-return shield surrounding the main magnet and defining an outside portion of the vacuum jacket, the ferromagnetic yoke being disposed in a low magnetic field region between the main magnet and the ferromagnetic flux-return shield.

9. The apparatus as set forth in claim 7, wherein a bore tube defines a portion of the vacuum jacket, the apparatus further including:
   a radio frequency coil and radio frequency screen disposed on opposite sides of the bore tube.

10. The apparatus as set forth in claim 9, wherein:
    the radio frequency screen is disposed on a surface of the bore tube inside of the vacuum of the vacuum jacket, and is tapered such that a separation between the radio frequency coil and the and the radio frequency screen is smaller at the center of the coil and larger at the ends of the coil.

11. The apparatus as set forth in claim 1, wherein the magnetic field gradient system further includes:
    magnetic field sensors sensing a magnetic field in the examination region; and
    one or more power channels driving the plurality of magnetic field gradient coils to produce a selected magnetic field gradient in the examination region, the one or more power channels being feedback controlled using the magnetic field sensors to maintain the selected magnetic field gradient.

12. The apparatus as set forth in claim 1, wherein the main magnet is bilaterally symmetric and includes:
    (i) two central electrically conductive windings one on each side of the plane of bilateral symmetry; and
    (ii) series electrical connections across the plane of bilateral symmetry connecting every one or few windings of the central electrically conductive winding on one side of the plane of bilateral symmetry with a corresponding one or few windings of the central electrically conductive winding on the other side of the plane of bilateral symmetry, a maximum voltage induced across the plane of bilateral symmetry in any portion of the central windings being limited by the series connections.

13. A magnetic resonance imaging apparatus comprising:
a main magnet surrounding an examination region and generating a main magnetic field in the examination region; and
a magnetic field gradient system disposed outside of the main magnet, the magnetic field gradient system including:
a ferromagnetic yoke including a plurality of ferromagnetic flux distribution elements,
a plurality of ferromagnetic cross bars magnetically coupled with the ferromagnetic flux distribution elements, and
a plurality of magnetic field gradient coils magnetically coupled with the ferromagnetic yoke and selectively producing magnetic flux in the ferromagnetic yoke, the magnetic field gradient coils being wrapped around the ferromagnetic cross bars, the magnetic flux in the ferromagnetic yoke producing selected magnetic field gradients in the examination region.

14. The apparatus as set forth in claim 13, wherein the ferromagnetic flux distribution elements are ferromagnetic rings of constant or varying thickness, the ferromagnetic cross-bars are generally transverse to the ferromagnetic rings, and the ferromagnetic yoke.

15. The apparatus as set forth in claim 13, wherein the ferromagnetic flux distribution elements are made of a material with a relative permeability of between about ten and about forty, and the ferromagnetic cross-bars have a relative permeability larger than the relative permeability of the ferromagnetic flux distribution elements.

16. The apparatus as set forth in claim 13, wherein the magnetic field gradient coils include:
first magnetic field gradient coils wrapped around the first ferromagnetic cross-bars, the first magnetic field gradient coils being selectively energized to produce a first transverse magnetic field gradient in the examination region.

17. The apparatus as set forth in claim 16, wherein the magnetic field gradient coils further include:
second magnetic field gradient coils wrapped around second ferromagnetic cross-bars, the second magnetic field gradient coils being selectively energized to produce a second transverse magnetic field gradient orthogonal to the first transverse magnetic field gradient in the examination region.

18. The apparatus as set forth in claim 13, wherein the plurality of ferromagnetic flux distribution elements include a center ferromagnetic flux distribution element at the center of the magnet, and the magnetic field gradient coils include:
two electrically conductive windings wrapped around each cross-bar on either side of the center ferromagnetic flux distribution element, each of the two electrically conductive windings producing magnetic flux in the crossbar in a direction one of (i) toward or (ii) away from the center ferromagnetic flux distribution element.

19. The apparatus as set forth in claim 13, further including:
a plurality of power channels independently driving each of the magnetic field gradient coils to generate a transverse gradient at a selected orientation based on the relative power delivered by each of the plurality of power channels.

20. The apparatus as set forth in claim 13, wherein the ferromagnetic yoke includes ferromagnetic flux distribution elements having a relative permeability of between about ten and about forty.

21. The apparatus as set forth in claim 20, wherein the ferromagnetic flux distribution elements are made of one of laminated and powdered ferromagnetic material.

22. A magnetic field gradient system comprising:
a ferromagnetic yoke including a plurality of ferromagnetic flux distribution elements magnetically coupled by cross-bars; and
a plurality of magnetic field gradient coils magnetically coupled with the ferromagnetic yoke and selectively producing magnetic flux in the ferromagnetic yoke, the magnetic flux in the ferromagnetic yoke producing selected magnetic field gradients in an examination region.

23. A magnetic resonance imaging apparatus comprising:
a main magnet including a plurality of generally annular magnet segments surrounding an examination region and generating a main magnetic field in the examination region;
a magnetic field gradient system including a plurality of ferromagnetic flux distribution elements to generate selected magnetic field gradients in the examination region, the ferromagnetic flux distribution elements being disposed between the generally annular magnets;
a vacuum jacket containing the main magnet and the magnetic field gradient system, the vacuum jacket having a wall defining a bore of the imaging apparatus, the examination region being disposed in the bore;
a radio frequency coil disposed on a surface of the bore outside of the vacuum jacket; and
a radio frequency screen disposed on a surface of the bore inside of the vacuum jacket.

24. The apparatus as set forth in claim 23, wherein the radio frequency coil includes:
a plurality of electrically conductive strip-lines defining coil rungs.

25. The apparatus as set forth in claim 24, wherein the radio frequency screen is tapered to provide a smaller separation between the screen and the coil at a center of the coil and a larger separation between the screen and the coil at the ends of the coil.

* * * * *